(12) United States Patent
Ash

(10) Patent No.: US 7,199,674 B2
(45) Date of Patent: *Apr. 3, 2007

(54) LOW PHASE NOISE, WIDE TUNE RANGE SAW OSCILLATORS AND METHODS OF OPERATING THE SAME

(75) Inventor: Darrell Lee Ash, Sachse, TX (US)

(73) Assignee: RF Monolithics, Inc., Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/156,888

(22) Filed: Jun. 20, 2005

(65) Prior Publication Data

US 2005/0242891 A1    Nov. 3, 2005

Related U.S. Application Data

(63) Continuation of application No. 09/801,411, filed on Mar. 8, 2001, now Pat. No. 6,909,334.

(51) Int. Cl.
 *H03B 11/10* (2006.01)
(52) U.S. Cl. .............................. 331/107 A; 331/177 V; 331/116 M; 331/107 DP; 331/116 R
(58) Field of Classification Search ............ 331/177 V, 331/107 A, 116 M, 107 DP, 36 C, 167
See application file for complete search history.

(56) References Cited

U.S. PATENT DOCUMENTS

| | | | |
|---|---|---|---|
| 4,560,951 A | 12/1985 | Futterer | |
| 4,581,592 A | 4/1986 | Bennett | |
| 5,608,360 A | 3/1997 | Driscoll | |
| 6,426,683 B1 | 7/2002 | Gu et al. | |
| 6,909,334 B2 * | 6/2005 | Ash ........................ | 331/107 A |

FOREIGN PATENT DOCUMENTS

| | | |
|---|---|---|
| DE | 196 34 622 A1 | 3/1998 |
| EP | 0 386 498 A1 | 2/1990 |

(Continued)

OTHER PUBLICATIONS

Schmitt, R.F., et al., "Designing an EMC-Compliant UHF Oscillator", RF Design Cardiff Publishing Co., Englewood, CO. U.S., vol. 23, NR. 10, pp. 40, 42, 44, 46, 48, 50, 52, 54, XP001025221, ISSN: 0163-321X.

(Continued)

*Primary Examiner*—Arnold Kinkead

(57) ABSTRACT

A two port, single pole SAW resonator is employed for a local oscillator to eliminate the secondary frequency responses of the prior art without adding additional inductances and capacitances within an amplifier stage. The stray capacitance which is seen within the equivalent circuit of a single pole, two port SAW resonator at a port for the SAW resonator is tuned out by coupling an appropriately sized inductance in parallel with that stray capacitance. Access to the series resonator within the SAW resonator equivalent circuit is thus provided, permitting direct tuning of the resonant frequency for the SAW resonator. The high Q of the SAW resonator ensures low phase noise/edge jitter, while direct tuning of the series resonator enables a wide tune range. The tunable SAW resonator circuit is thus well-suited for use in a low phase noise tunable oscillator employed, for instance, in clock recovery within SONET applications.

20 Claims, 7 Drawing Sheets

FOREIGN PATENT DOCUMENTS

GB  2 047 491 A1  11/1980
JP  11-346142  12/1999

OTHER PUBLICATIONS

Driscoll, M.M., "Linear Frequency Tuning of Saw Resonators", pp. 191-194, XPO10090619.

Parker, T.E., et al., "Precision Surface-Acoustic-Wave (SAW) Oscillators", IEEE Transactions on Ultrasonics, Ferroelectrics and Frequency Control, IEEE Inc., New York, U.S., vol. 35, NR. 3, pp. 342-363, XP000047422, ISSN: 0885-3010.

Rohde, U.L., "Designing Saw Resources and DRO Oscillators Using Nonlinear CAD Tool", Frequency Control Symposium, 1995, 49th Proceedings of the 1995 IEEE International San Francisco, CA, U.S.A. 31 US, pp. 379-395, XP010155195, ISBN: 0-7803-2500-1.

Wessendorf, K. et al., "Oscillator Design Techniques Allow High-Frequency Applications", RF Design, Cardiff Publishing Co., Englewood, CO. U.S., vol. 21, NR. 3, pp. 38, 40, 42, 44, XP000755034, ISSN: 0163-321X.

Gonda, J. et al., "A Wide Pull Range Hybrid VCSO for Optical Transmission Networks", pp. 59-63, XP010090597.

"Applications des Resonateurs a Ondes de Surface", Electronique Radio Plans, SPE, Paris, France, 564, XP000477719, pp. 87-95.

* cited by examiner

LOW PHASE NOISE, WIDE TUNE RANGE SAW OSCILLATORS AND METHODS OF OPERATING THE SAME

CROSS-REFERENCE TO RELATED APPLICATIONS

This application is a continuation of prior application Ser. No. 09/801,411 filed on Mar. 8, 2001, now U.S. Pat. No. 6,909,334, which is incorporated herein by reference. The present invention is related to the subject matter of commonly assigned, copending U.S. patent application Ser. No. 09/801,452, now U.S. Pat. No. 6,914,493, which is incorporated herein by reference.

TECHNICAL FIELD OF THE INVENTION

The present invention is directed, in general, to oscillator circuits and, more specifically, to, oscillators employed in applications requiring both low phase noise and significant tune range.

BACKGROUND OF THE INVENTION

Synchronous optical networks (SONETs), which provide very high data rate fiber optic links for communications, require low phase noise local oscillators for clock recovery. Phase noise, and the resulting effect of signal edge jitter in the local oscillator output, limits the clock speed or pulse rate for clock recovery by contributing to the required pulse width or duration for accurate operation. Additionally, the local oscillator employed in such applications should be frequency-tunable, allowing the local oscillator to be set or adjusted to a specific frequency to, for example, track frequency variations in the received clock signal. However, maintaining low-phase noise and providing significant tune range for a local oscillator have proven to be conflicting objectives.

Local oscillators are often constructed by placing a device within the feedback loop of an amplifier to cause the amplifier output to oscillate. Crystal oscillators are commonly employed for this purpose, but introduce substantial phase noise and therefore constrain use of the oscillator to lower frequency applications. While the output of a low frequency crystal stabilized oscillator may be multiplied up to a higher frequency or utilized with a frequency synthesizer, the phase noise is also multiplied up or otherwise translated proportionally into the output signal.

Surface acoustic wave (SAW) devices, when utilized in place of a crystal as a frequency reference in an amplifier-based oscillator, intrinsically have a high frequency response quality factor (Q) and therefor automatically provide low phase noise in the oscillator output. However, since SAW oscillators do not have the frequency accuracy of a crystal oscillator, the oscillator must be made frequency tunable to be adjusted to the precise frequency of interest. Typically this is accomplished through an adjustable phase shifter within the loop, with a substantial increase in phase noise.

U.S. Pat. No. 4,760,352 discloses a coupled resonator phase shift oscillator formed by connecting a SAW coupled (two pole) resonator within the feedback loop of an amplifier, and also describes earlier oscillators which employ a (SAW) delay line within the feedback network. However, both structures introduce approximately 180° phase shift across the passband, requiring a 180° phase shifter within the loop, which is difficult to build in a manner which is easily manufacturable. Moreover, a high Q circuit by definition exhibits a narrow passband within the frequency response curve, limiting the tune range of the oscillator to a small range of frequencies.

One approach to increasing the tune range of an oscillator employing a SAW resonator is disclosed in U.S. Pat. No. 6,239,664. Within a relatively narrow frequency range, the SAW resonator has an equivalent circuit similar to that of a bulk crystal, as shown in FIG. 4. Within that frequency range, the equivalent circuit 401 of the SAW resonator includes a series resonator comprising an inductance $L_M$, a capacitance $C_M$ and a resistance $R_M$ all connected in series, with a shunt capacitance $C_O$ in parallel with the series resonator and formed by the internal parasitic and package capacitance of the SAW resonator. To make the SAW resonator tunable, an inductor $L_O$ sized to effectively tune out capacitance $C_O$ is connected in parallel with the SAW resonator 401 and a variable tuning capacitance $C_{TUNE}$, such as a varactor diode, is connected in series with the SAW resonator 401. As the capacitance of tuning capacitance $C_{TUNE}$ decreases, the center frequency for the passband of the single port resonator circuit 400 increases.

The frequency range across which the SAW resonator 401 has the equivalent circuit shown, while relatively small, is both larger than the passband of the SAW and large enough to provide the tuning capability required. The disadvantage of the single port SAW resonator circuit 400 is that the circuit 400 has one or more secondary responses 500, as shown in FIG. 5, because the shunt inductor $L_O$ resonates with the tuning capacitance $C_{TUNE}$ at another frequency (other than the desired passband center frequency). Accordingly, U.S. Pat. No. 6,239,664 discloses (not shown in FIG. 4) an additional inductance and capacitance in conjunction with an amplifier stage to effectively eliminate any secondary responses. Within the passband of the SAW resonator, the SAW resonator circuit 400 provides a low impedance path to ground for the amplifier, forming a Colpitts oscillator. However, the amplifier must present a negative resistance which is greater than the resistance of the tuned SAW resonator circuit 400 in order for the circuit to oscillate.

Due to the additional tuning requirements necessary to tune out the secondary response(s), the SAW resonator oscillator disclosed in U.S. Pat. No. 6,239,664 is not easily manufactured reliably in quantity, and spurious responses are seen during manufacturing. Moreover, the structure is complex, with the tuning of the inductive coils and the values of capacitances, including the parasitic capacitances, being critical. Finally, the structure is large, requiring a dual in-line package for a practical implementation.

There is therefore a need in the art for a local oscillator employing a SAW resonator for low phase noise while providing an acceptable tune range.

SUMMARY OF THE INVENTION

To address the above-discussed deficiencies of the prior art, it is a primary object of the present invention to provide, for use in a local oscillator, a two port, single pole SAW resonator circuit eliminating the secondary frequency responses of the prior art without adding additional inductances and capacitances within an amplifier stage. The stray capacitance which is seen within the equivalent circuit of a single pole, two port SAW resonator at a port for the SAW resonator is tuned out by coupling an appropriately sized inductance in parallel with that stray capacitance. Access to the series resonator within the SAW resonator equivalent circuit is thus provided, permitting direct tuning of the resonant frequency for the SAW resonator. The high Q of the SAW resonator ensures low phase noise/edge jitter, while direct tuning of the series resonator enables a wide tune range. The tunable SAW resonator circuit is thus well-suited for use in a low phase noise tunable oscillator employed, for instance, in clock recovery within SONET applications.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "lor," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 3A–3D, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged device.

Figure 1:
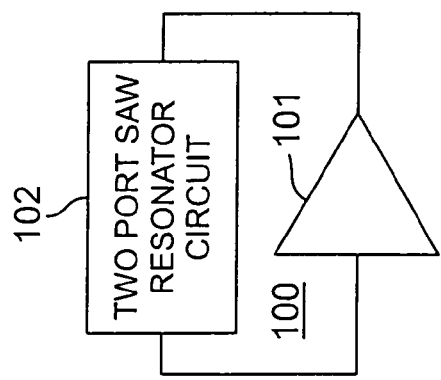
FIG. 1 depicts a circuit diagram for an exemplary oscillator including a two port tunable SAW resonator circuit according to one embodiment of the present invention.

FIG. 1 depicts a circuit diagram for an exemplary oscillator including a two port tunable SAW resonator circuit according to one embodiment of the present invention. Oscillator 100 may be, for example, a local oscillator within a SONET clock recovery-circuit. Oscillator 100 includes an amplifier 101 connected in a series loop with a two port SAW resonator circuit 102, forming a Pierce oscillator. Two port SAW resonator circuit 102 may have either configuration shown in FIGS. 2A–2B.

Figure 2A:
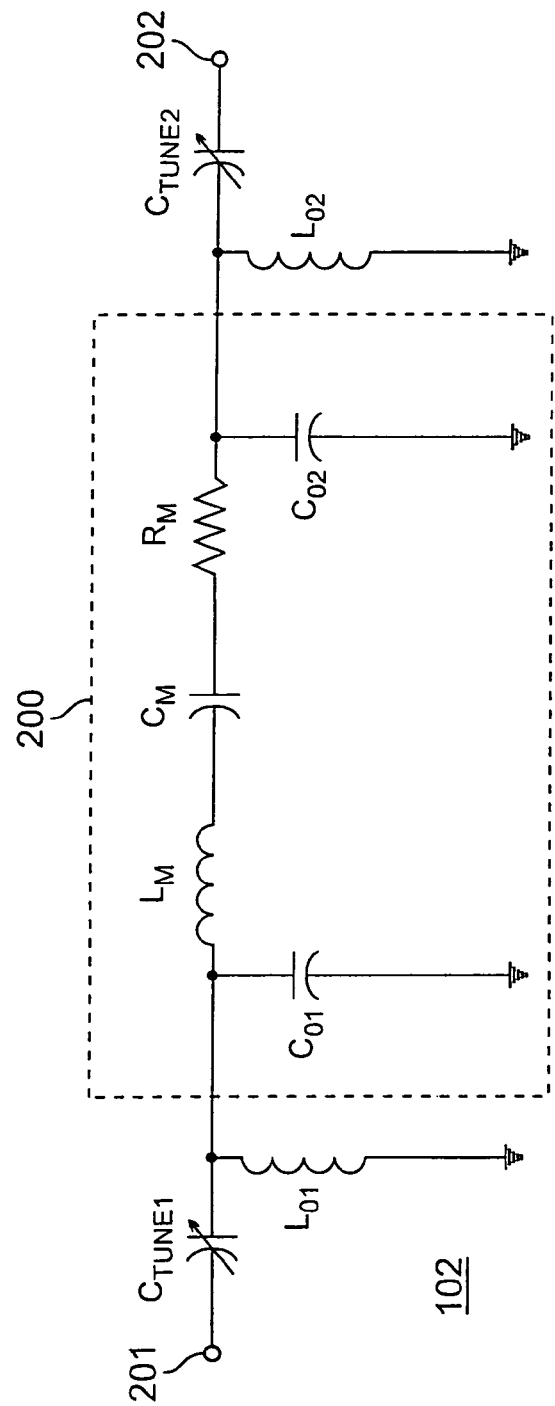
FIG. 2A illustrates in greater detail a circuit diagram for a two port SAW resonator circuit in the exemplary oscillator according to one embodiment of the present invention.

FIG. 2A illustrates in greater detail a circuit diagram for a two port SAW resonator circuit in the exemplary oscillator according to one embodiment of the present invention. Two port SAW resonator circuit 102 includes a two port SAW resonator 200, depicted in FIG. 2A by the equivalent circuit for the two port SAW resonator within the frequency range of interest. The equivalent circuit of the two port SAW resonator 200 within the target frequency range includes a series resonator comprising a motional inductance $L_M$, a motional capacitance $C_M$ and a motional resistance $R_M$ all connected in series. "Stray" capacitances $C_{O1}$ and $C_{O2}$, formed by the internal parasitic and package capacitance (and any other unintentional capacitance) of the SAW resonator as seen from one of the ports of the SAW resonator 200, are connected between the ends of the series resonator and ground.

To make the SAW resonator 200 tunable in the present invention, two port. SAW resonator circuit 102 includes inductances $L_{O1}$ and $L_{O2}$ coupled between the ports of the SAW resonator 200 and ground, each inductance $L_{O1}$ and $L_{O2}$ sized to effectively tune out capacitances $C_{O1}$ and $C_{O2}$, respectively. Variable tuning capacitances $C_{TUNE1}$ and $C_{TUNE2}$ which may be varactor diodes, are each connected in series between one port of the SAW resonator 200 and either an input port 201 or an output port 202 for the two port SAW resonator circuit 102. With capacitances $C_{O1}$ and $C_{O2}$ negated, either capacitance $C_{TUNE1}$ or $C_{TUNE2}$ alters the resonant frequency of the series resonator. Accordingly, as the capacitance of tuning capacitance(s) $C_{TUNE1}$ and/or $C_{TUNE2}$ decreases, the center frequency for the passband of the two port SAW resonator circuit 102 increases. The desired tune range is thereby achieved with—because a high Q SAW device is employed—inherent low phase noise.

Prior art efforts to employ a SAW resonator within a local oscillator failed to consider removing the stray capacitances $C_{O1}$ and $C_{O2}$ within the equivalent circuit of a SAW resonator to allow access to the series resonant circuit within the equivalent circuit for direct tuning of the SAW resonator. Instead, prior art efforts at tuning SAW resonators have utilized tuning circuits which simply tuned the overall circuit across the passband of the SAW device, limiting tune range to the inherently narrow passband of the SAW device.

To produce a high Q SAW device, the motional capacitance $C_M$ should provide a high capacitive reactance, and therefore should be a very small capacitance on the order of femptoFarads (fF). For SONET clock recovery applications, some of which require a resonant frequency of 622 megahertz (MHz), a motional inductance $L_M$ on the order of milliHenrys (mH) is required. The stray capacitances $C_O$, and $C_{O2}$ are (both) typically on the order of 1–2 picoFarads (pF). Accordingly, unless the stray capacitances $C_{O1}$ and $C_{O2}$ are tuned out by parallel inductances $L_{O1}$ and $L_{O2}$ (i.e., inductances $L_{O1}$ and $L_{O2}$ resonate with stray capacitances $C_{O1}$ and $C_{O2}$ at the desired operational frequency) as described above, efforts to directly tune the series resonator within the equivalent circuit of the SAW resonator device 200 will have no effect on the motional capacitance $C_M$ of the series resonator due to the difference in magnitudes of the stray capacitances $C_{O1}$ and $C_{O2}$ and the motional capacitance $C_M$.

Inductances $L_{O1}$ and $L_{O2}$ need not completely tune out stray capacitances $C_{O1}$ and $C_{O2}$, but instead need merely reduce the magnitude of any residual stray capacitance to a level which is insignificant when compared to the magnitude of the motional capacitance $C_M$. For some applications, use of inductance values lower than that required for resonance can increase the tuning range of the resonant circuit. The size of inductances $L_{O1}$ and $L_{O2}$ are therefore noncritical, and manufacturing variances may be tolerated. Those skilled in the art will further recognize that, in lieu of shunt inductances $L_{O1}$ and $L_{O2}$ as depicted in FIG. 2A, inductances may be connected in series with tuning capacitance $C_{TUNE1}$ between the input port 201 and SAW resonator 200, in series with tuning capacitance $C_{TUNE2}$ between output port 202 and SAW resonator 200, or both. Such series connected-inductances will, if appropriately sized, resonate with stray capacitances $C_{O1}$ and $C_{O2}$ to effectively tune out such stray capacitances and permit direct access to the series resonator within the equivalent circuit for SAW resonator 200. Moreover, a combination of series-connected and shunt inductances which, together, effectively tune out stray capacitances may also be employed.

Although necessarily small to achieve the desired resonant frequency and a high Q, the motional capacitance CM employed for a single pole, two port SAW resonator 200 of the type disclosed should be as large as possible to allow tuning capacitances $C_{TUNE1}$ or $C_{TUNE2}$ to significantly impact the series resonator and provide acceptable tune range. With a high impedance SAW resonator 200 providing insertion loss on the order of 10 decibels (dB), the required motional capacitance is too small to be tuned. However, by utilizing an optimized, low impedance SAW resonator 200, the same Q may be achieved using a larger motional capacitance $C_M$. A suitable value for the motional capacitance $C_M$ is approximately 0.6 fF for a 622 MHz center frequency. A motional capacitance $C_M$ of approximately half that value would significantly reduce the tune range. For a motional capacitance $C_M$ of approximately 0.6 fF, tuning capacitances $C_{TUNE1}$ or $C_{TUNE2}$ may have a tuning range of approximately 2.0–0.4 pF.

Figure 2B:
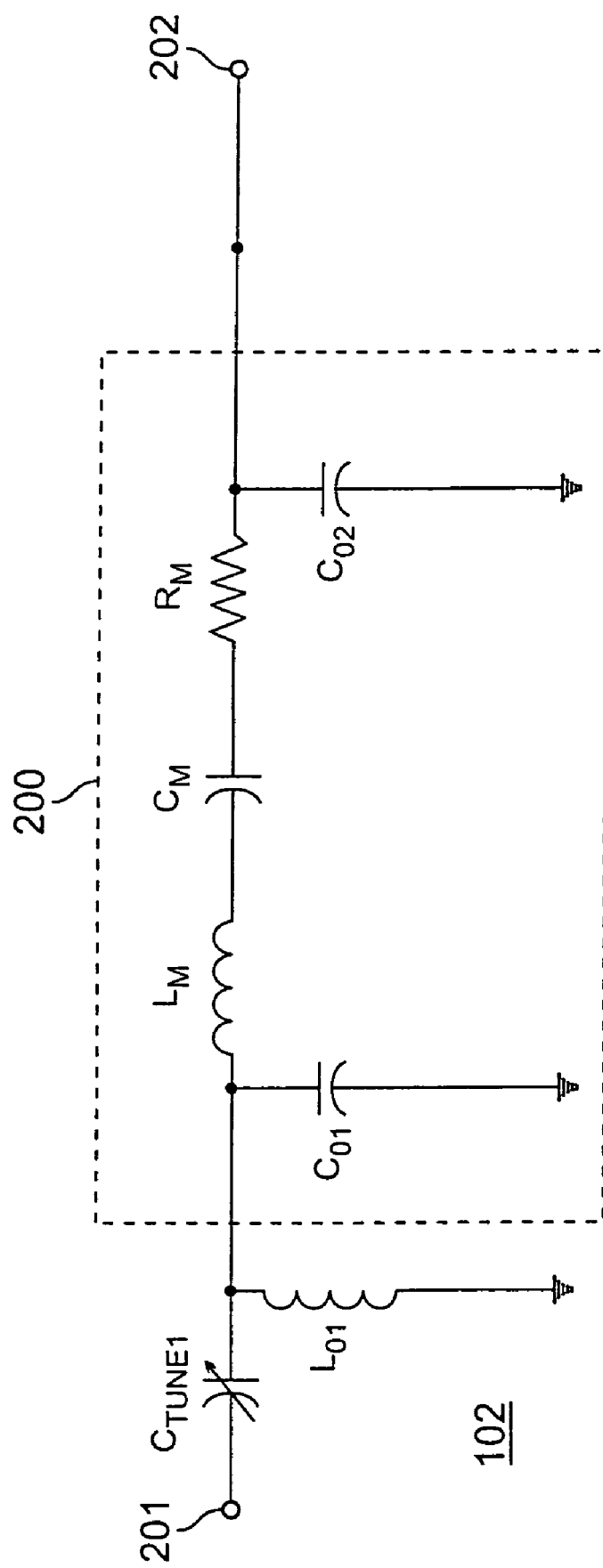
FIG. 2B illustrates in greater detail a circuit diagram for a two port SAW resonator circuit in the exemplary oscillator according to another embodiment of the present invention.

FIG. 2B illustrates in greater detail a circuit diagram for a two port SAW resonator circuit in the exemplary oscillator according to another embodiment of the present invention. In this alternative embodiment, the two port SAW resonator circuit 102 contains only a single inductance $L_{O1}$ and a single tuning capacitance $C_{TUNE1}$ at only one port of the SAW resonator 200. While providing inductances $L_{O1}$ and $L_{O2}$ and tuning capacitances $C_{TUNE1}$ and $C_{TUNE2}$ at both ports of the SAW resonator 200 as depicted in FIG. 2 provides greater tune range, when SAW resonator circuit 102 drives a load (not shown) of approximately 50–100 ohms ($\Omega$) or less in parallel with stray capacitance $C_{O2}$, the impedance of stray capacitance $C_{O2}$ becomes insignificant and the series resonator within SAW resonator 200 may be tuned utilizing only a single tuning capacitance $C_{TUNE1}$ at the input port for the SAW resonator 200. Accordingly, the second inductance $L_{O2}$ and tuning capacitance $C_{TUNE2}$ are optional. When not substantially tuned out with a parallel inductance, however, stray capacitance $C_{O2}$ will continue to prevent direct access to the series resonator within the equivalent circuit for the SAW resonator 200 for direct tuning of the resonant frequency using tuning capacitance $C_{TUNE2}$.

While the alternative embodiment illustrates the inductance $L_{O2}$ and tuning capacitance $C_{TUNE2}$ between the SAW resonator 200 and the output port 202 being eliminated, with an appropriate input impedance the inductance $L_{O1}$ and tuning capacitance $C_{TUNE1}$ between the SAW resonator 200 and the input port 201 may be eliminated instead.

Whereas the prior art provides a tune range of perhaps 60 KHz in connection with a high Q SAW resonator, the present invention with the component values described provides for either embodiment a tune range of at least approximately 400 KHz. For SONET clock recovery applications in which variances of up to 500 parts-per-million (ppm) must be tolerated, the required tune range for a center frequency of 622 MHz is approximately 300 KHz.

FIGS. 3A through 3D are frequency response plots illustrating the operation of the two port SAW resonator according to one embodiment of the present invention. The output amplitude and phase for a tunable SAW resonator circuit of the type described above are plotted for a 2.5 MHz range of frequencies centered on 622.2 MHz. The output amplitude 301 is plotted on a scale of 5 decibels (dB) per division, while the output phase 302 is plotted on a linear scale of 90° per division.

Figure 3A:
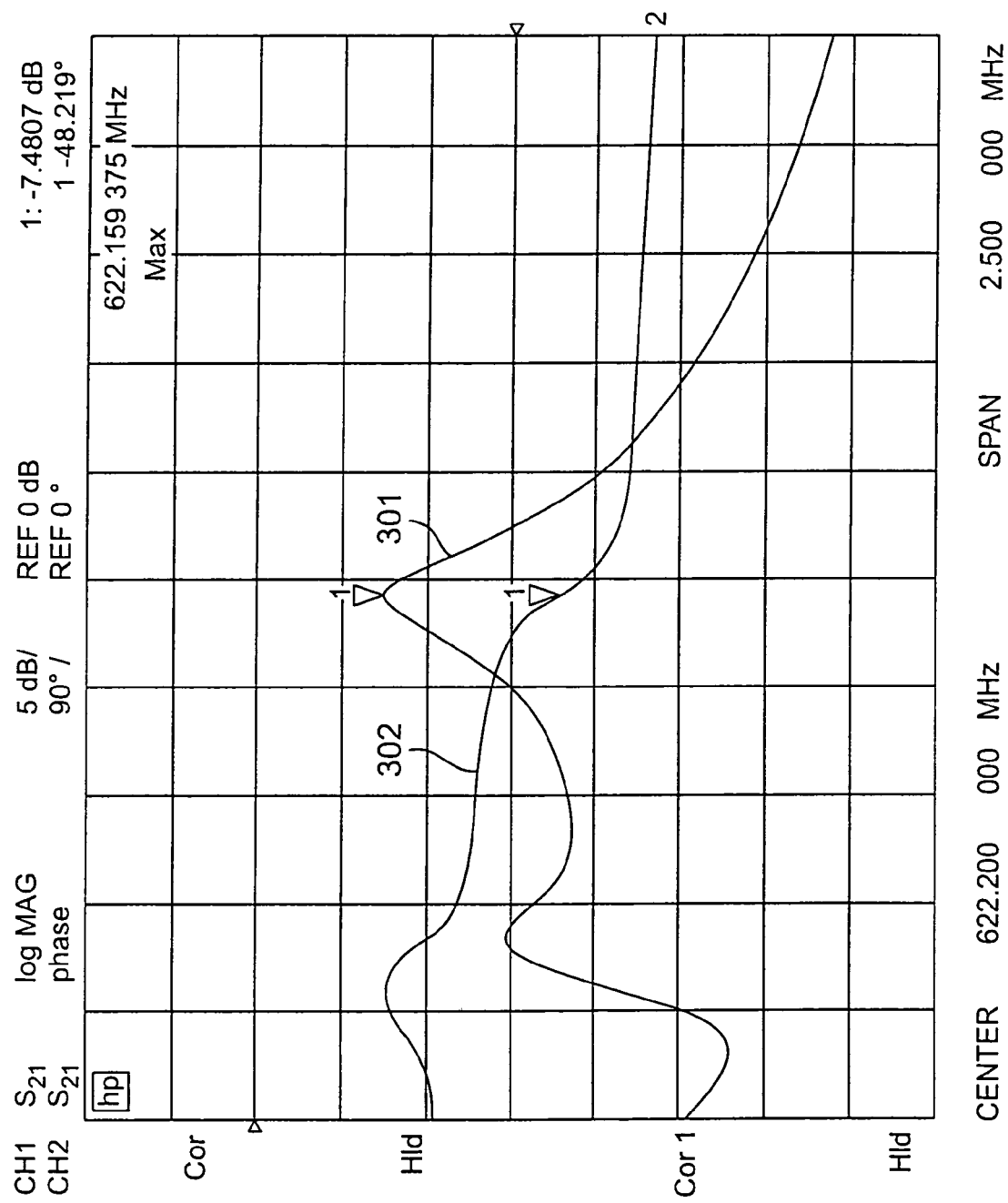
FIGS. 3A through 3D are frequency response plots illustrating the operation of the two port SAW resonator circuit according to one embodiment of the present invention.
Figure 3B:
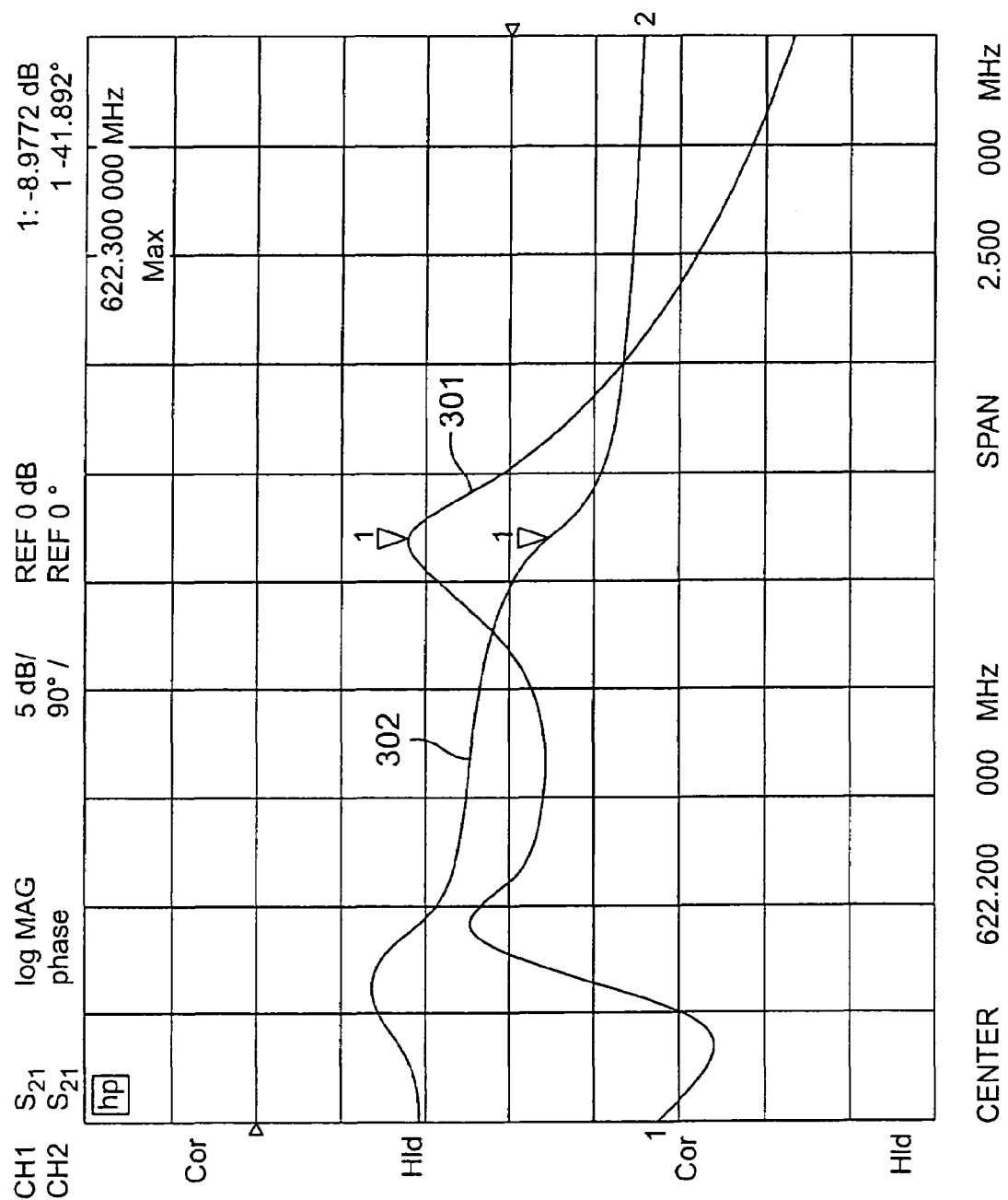
Figure 3C:
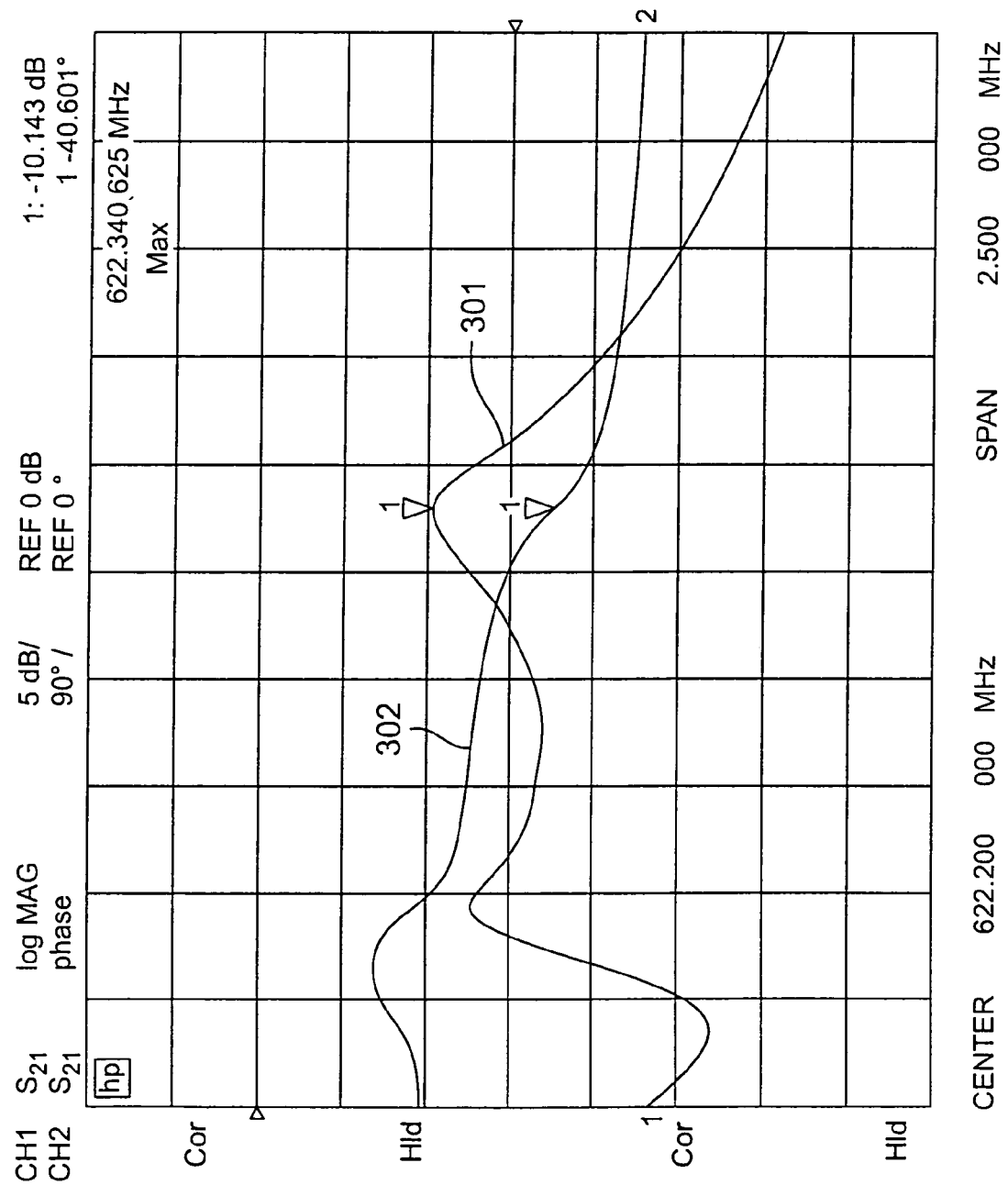
Figure 3D:
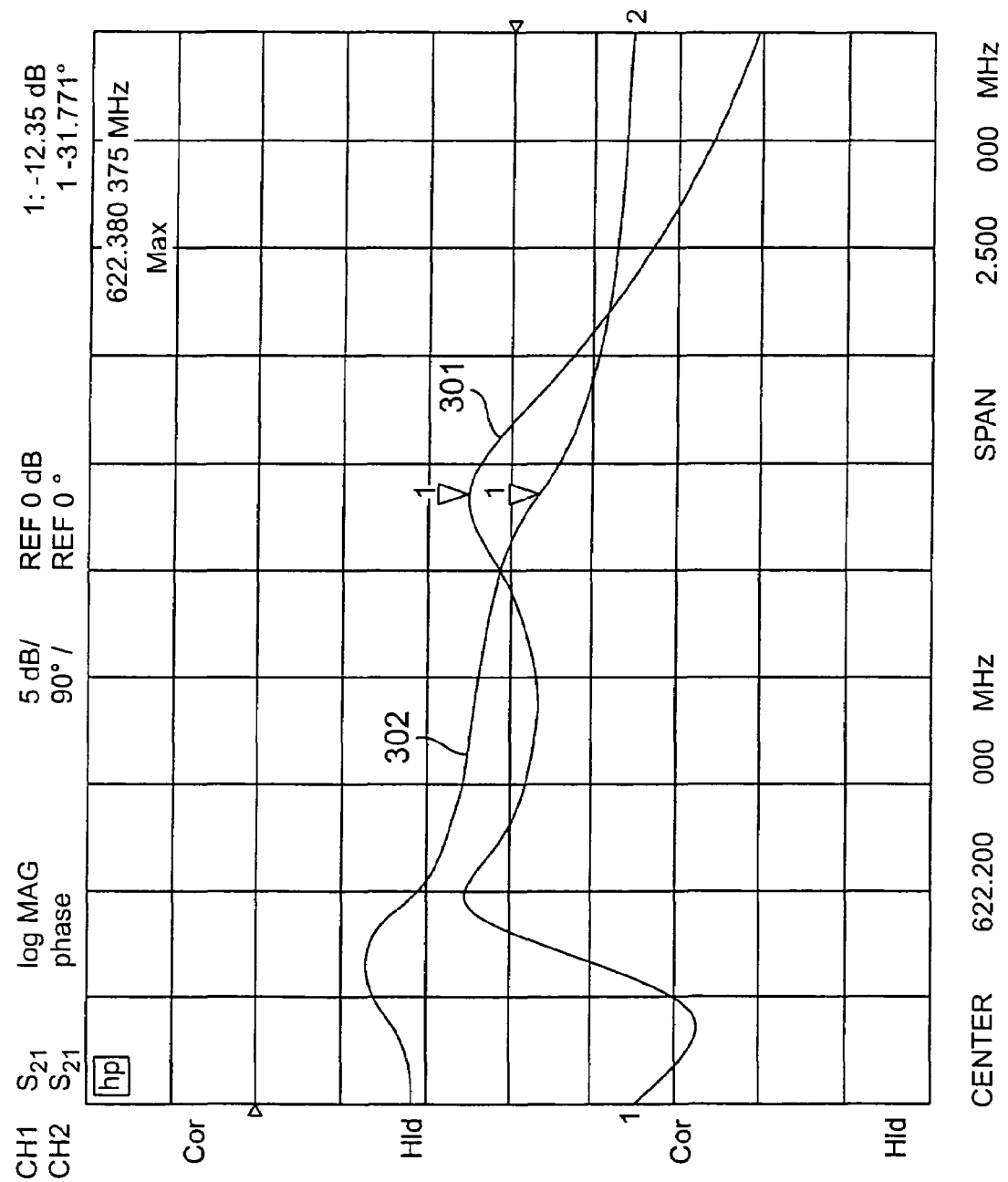
Figure 4:
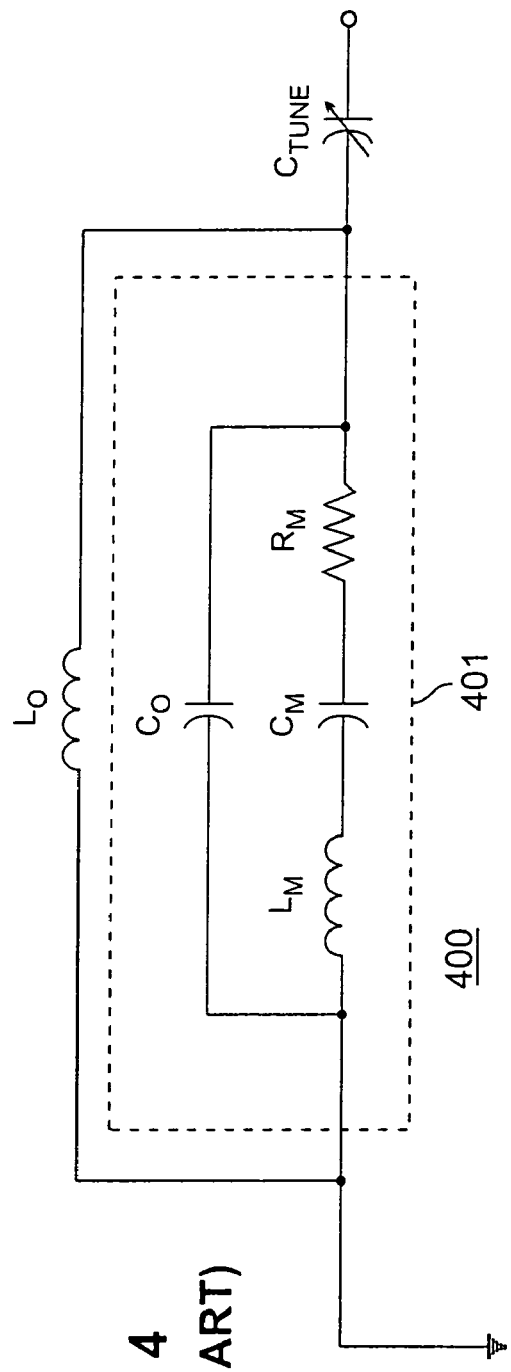
FIG. 4 is a circuit diagram of a single port SAW resonator circuit for use in an oscillator.
Figure 5:
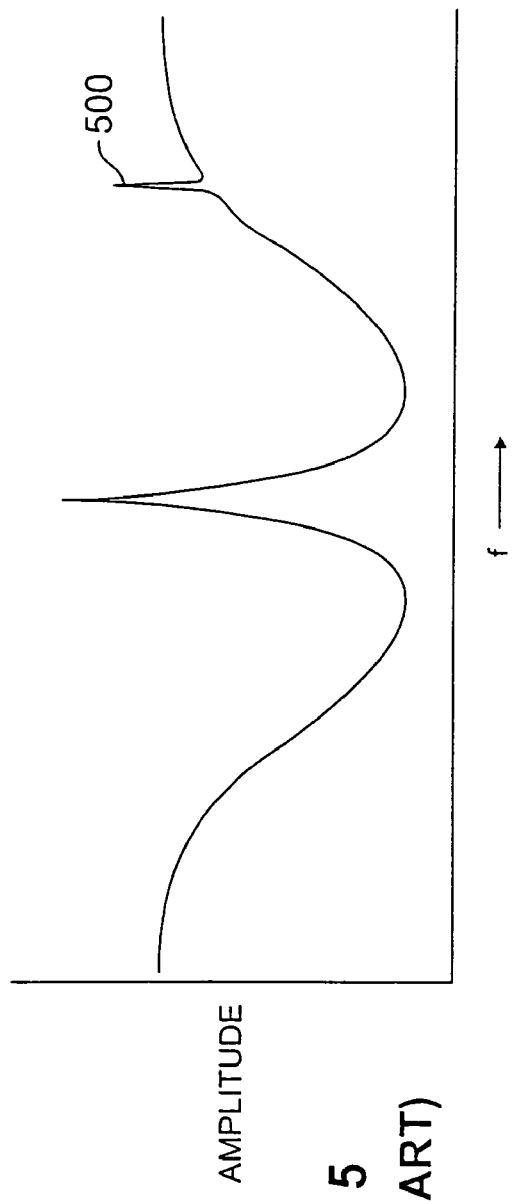
FIG. 5 is a frequency response plot for a single port SAW resonator circuit such as the one in FIG. 4.

In FIG. 3A, the tuning voltage applied to varactor diodes within the tunable SAW resonator circuit to adjust the capacitance is zero. The resulting output signal amplitude has a center frequency of 622.159375 MHz, a maximum signal amplitude of −7.4807 dB, and a phase of −48.219°. In FIG. 3B, the tuning voltage applied to the varactor diodes is increased to 2.5 volts (V), moving the center frequency to 622.300000 MHz, the maximum signal amplitude to −8.9772 dB, and the phase to −41.892°. The tuning voltage applied to the varactor diodes for the plot in FIG. 3C is 2.75 V, resulting in a center frequency of 622.340625 MHz, a maximum signal amplitude to −10.143 dB, and a phase of −40.601°. Finally, the tuning voltage in FIG. 3D is 3.0 V, the center frequency is 622.380375 MHz, the maximum amplitude is −12.35 dB, and the phase is −31.771°.

The SAW oscillator 100 of the present invention, which is a voltage controlled SAW oscillator (VCSO), may be advantageously employed within the phase lock loop (PLL) of a clock recovery circuit, particularly for SONET applications. SAW oscillator 100 exhibits very low phase noise and edge jitter while providing sufficient tune range to track slight changes (error) in frequency during operation, allowing for manufacturing variances, and accommodating temperature variations.

Although the present invention has been described in detail, those skilled in the art should understand that they can make various changes, substitutions and alterations herein without departing from the spirit and scope of the invention in its broadest form.

What is claimed is:

1. For use in an oscillator, a two port SAW resonator circuit for providing a tunable low phase noise oscillator signal comprising:
   a two port SAW resonator for which an equivalent circuit includes:
      a motional inductance, a motional capacitance, and a motional resistance connected in series between the two ports, and
      a first parasitic capacitance between a first port of the SAW resonator and a common voltage;

a first inductance coupled between the first port of the SAW resonator and the common voltage, wherein the first inductance is sized to approximately offset a reactance of the first parasitic capacitance at a selected frequency;

a first variable tuning capacitance coupled between the first port of the SAW resonator and a first port for the SAW resonator circuit; and an output port operable to be coupled to a load providing an impedance lower than an impedance of the first parasitic capacitance.

2. The SAW resonator circuit as set forth in claim 1 wherein the common voltage is a ground voltage and wherein the first inductance is connected in parallel with the first parasitic capacitance between the first port and the ground voltage.

3. The SAW resonator circuit as set forth in claim 1 wherein the equivalent circuit for the SAW resonator also includes a second parasitic capacitance between a second port of the SAW resonator and the common voltage, the SAW resonator circuit further comprising:

a second inductance coupled between the second port of the SAW resonator and the common voltage, the second inductance sized to approximately offset a reactance of the second parasitic capacitance at the selected frequency.

4. The SAW resonator circuit as set forth in claim 3 further comprising:

a second variable tuning capacitance coupled between the first port of the SAW resonator and a second port for the SAW resonator circuit, wherein the first and second variable tuning capacitances form a series resonant circuit with the motional inductance, motional capacitance and motional resistance.

5. The SAW resonator circuit as set forth in claim 1 wherein adjusting a capacitance of the variable tuning capacitance alters a total capacitance for a series resonator circuit formed by the motional inductance, the motional capacitance, the motional resistance and the tuning capacitance.

6. The SAW resonator circuit as set forth in claim 1 further comprising:

the load connected to the output port.

7. The SAW resonator circuit as set forth in claim 1 wherein the first inductance enables the first variable capacitance to form a series resonant circuit with the motional inductance, the motional capacitance and the motional resistance at the selected frequency.

8. An oscillator including the SAW resonator circuit as set forth in claim 1, the oscillator comprising:

an amplifier; and the SAW resonator circuit connected in a series loop with the amplifier.

9. A two port SAW resonator circuit comprising:

a two port SAW resonator having a passband;

a first inductance coupled between the first port of the SAW resonator and a common voltage, the first inductance sized to resonate at frequencies within the passband with a first parasitic capacitance for the SAW resonator;

a first variable tuning capacitance coupled between the first port of the SAW resonator and a first port for the SAW resonator circuit; and an output port operable to be coupled to a load providing an impedance lower than an impedance of the first parasitic capacitance.

10. The SAW resonator circuit as set forth in claim 9 wherein the common voltage is a ground voltage and wherein the first inductance is connected in parallel with the first parasitic capacitance between the first port and the ground voltage.

11. The SAW resonator circuit as set forth in claim 9 further comprising:

a second inductance coupled between the second port of the SAW resonator and the common voltage, the second inductance sized to resonate at frequencies within the passband with a second parasitic capacitance for the SAW resonator.

12. The SAW resonator circuit as set forth in claim 9 further comprising:

a second variable tuning capacitance coupled between the first port of the SAW resonator and a second port for the SAW resonator circuit, wherein the first and second variable tuning capacitances form a series resonant circuit with a motional inductance, motional capacitance and motional resistance for the SAW resonator.

13. The SAW resonator circuit as set forth in claim 12 wherein adjusting a capacitance of the first or second variable tuning capacitance alters a passband for the series resonant circuit.

14. The SAW resonator circuit as set forth in claim 9 further comprising:

a load connected to an output port for the SAW resonator circuit, the load connected to the output port.

15. A two port SAW resonator circuit comprising:

a two port SAW resonator having a passband with a center frequency;

a first inductance coupled between the first port of the SAW resonator and a common voltage, the first inductance sized to resonate at the center frequency with a first parasitic capacitance for the SAW resonator;

a first variable tuning capacitance coupled between the first port of the SAW resonator and a first port for the SAW resonator circuit; and an output port operable to be coupled to a load providing an impedance lower than an impedance of the first parasitic capacitance.

16. The SAW resonator circuit as set forth in claim 15 wherein the common voltage is a ground voltage and wherein the first inductance is connected in parallel with the first parasitic capacitance between the first port and the ground voltage.

17. The SAW resonator circuit as set forth in claim 15 further comprising:

a second inductance coupled between the second port of the SAW resonator and the common voltage, the second inductance sized to resonate at the SAW resonator passband center frequency with a second parasitic capacitance for the SAW resonator.

18. The SAW resonator circuit as set forth in claim 15 further comprising:

a second variable tuning capacitance coupled between the first port of the SAW resonator and a second port for the SAW resonator circuit, wherein the first and second variable tuning capacitances form a series resonant circuit with a motional inductance, motional capacitance and motional resistance for the SAW resonator.

19. The SAW resonator circuit as set forth in claim 18 wherein adjusting a capacitance of the first or second variable tuning capacitance alters a passband for the series resonant circuit.

20. The SAW resonator circuit as set forth in claim 15 further comprising:

the load connected to the output port.

* * * * *

UNITED STATES PATENT AND TRADEMARK OFFICE
CERTIFICATE OF CORRECTION

PATENT NO. : 7,199,674 B2
APPLICATION NO. : 11/156888
DATED : April 3, 2007
INVENTOR(S) : Darrell Lee Ash It is certified that error appears in the above-identified patent and that said Letters Patent is hereby corrected as shown below:

Column 3, line 20, delete "lor" and replace with -- or --;

Column 4, line 30, delete "." after the term "port";

Column 4, line 61, delete "Co" and replace with -- $C_{ol}$ --;

Column 5, line 31, delete "CM" and replace with -- $C_m$ --.

Signed and Sealed this

Nineteenth Day of June, 2007

JON W. DUDAS
*Director of the United States Patent and Trademark Office*